US009666295B2

(12) United States Patent
Ma et al.

(10) Patent No.: US 9,666,295 B2
(45) Date of Patent: May 30, 2017

(54) SEMICONDUCTOR STORAGE DEVICE, AND METHOD FOR READING STORED DATA

(71) Applicant: KABUSHIKI KAISHA TOSHIBA, Minato-ku (JP)

(72) Inventors: Sibo Ma, Fujisawa (JP); Masahiro Yoshihara, Yokohama (JP); Katsumi Abe, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/990,090

(22) Filed: Jan. 7, 2016

(65) Prior Publication Data

US 2016/0189790 A1 Jun. 30, 2016

Related U.S. Application Data

(63) Continuation of application No. PCT/JP2013/068604, filed on Jul. 8, 2013.

(51) Int. Cl.
*G11C 16/04* (2006.01)
*G11C 16/28* (2006.01)
(Continued)

(52) U.S. Cl.
CPC .......... *G11C 16/28* (2013.01); *G11C 16/0483* (2013.01); *G11C 16/24* (2013.01); *G11C 16/26* (2013.01)

(58) Field of Classification Search
CPC ................................................ G11C 16/28
(Continued)

(56) References Cited

U.S. PATENT DOCUMENTS 7,486,562 B2 2/2009 Ogawa et al.
7,881,120 B2 2/2011 Yoshihara et al.
(Continued)

FOREIGN PATENT DOCUMENTS

JP 2006-79803 3/2006
JP 2009-43357 2/2009
(Continued)

OTHER PUBLICATIONS

International Search Report issued Aug. 13, 2013 in PCT/JP2013/068604 filed Jul. 8, 2013.
(Continued)

*Primary Examiner* — Hoai V Ho
(74) *Attorney, Agent, or Firm* — Oblon, McClelland, Maier & Neustadt, L.L.P.

(57) ABSTRACT

A semiconductor memory device capable of improving a read characteristic of a sense amplifier and a stored data read method are provided. The semiconductor memory device includes a sense amplifier and a controller. The sense amplifier has a first transistor that clamps a voltage of a bit line, a second transistor that is provided between a voltage node clamped by the first transistor and a reference voltage node, and a third transistor that is inserted between a charge/discharge node and the voltage node clamped by the first transistor. In a first operation mode, the controller turns on the first transistor and the second transistor and turns off the third transistor. In the second operation mode, the third transistor is turned on and in the third operation mode, the first transistor is turned on, the second transistor is turned off, the third transistor is turned on, and the fourth transistor is turned on.

9 Claims, 10 Drawing Sheets

(51) Int. Cl.
*G11C 16/24* (2006.01)
*G11C 16/26* (2006.01)

(58) Field of Classification Search
USPC .................................................. 365/185.25
See application file for complete search history.

(56) References Cited

U.S. PATENT DOCUMENTS

| | | | |
|---|---|---|---|
| 7,920,435 | B2 | 4/2011 | Ogawa |
| 7,974,133 | B2 | 7/2011 | Dunga et al. |
| 2008/0239805 | A1* | 10/2008 | Shiga ................ G11C 11/5628 365/185.03 |
| 2009/0040834 | A1 | 2/2009 | Ogawa |
| 2009/0244978 | A1 | 10/2009 | Yoshihara et al. |
| 2011/0075485 | A1 | 3/2011 | Fukuda et al. |
| 2011/0176366 | A1 | 7/2011 | Tanaka et al. |
| 2011/0305089 | A1* | 12/2011 | Abe ..................... G11C 11/5642 365/185.17 |
| 2013/0003454 | A1 | 1/2013 | Edahiro et al. |
| 2013/0155778 | A1 | 6/2013 | Sakaguchi et al. |

FOREIGN PATENT DOCUMENTS

| | | |
|---|---|---|
| JP | 2009-43358 | 2/2009 |
| JP | 2009-230827 | 10/2009 |
| JP | 2011-70725 | 4/2011 |
| JP | 2011-146100 | 7/2011 |
| JP | 2012-514820 | 6/2012 |
| JP | 2013-12267 | 1/2013 |
| JP | 2013-125569 | 6/2013 |

OTHER PUBLICATIONS

Office Action issued in Taiwanese Patent Application No. 102126980 on May 8, 2015 with English-language translation.

* cited by examiner

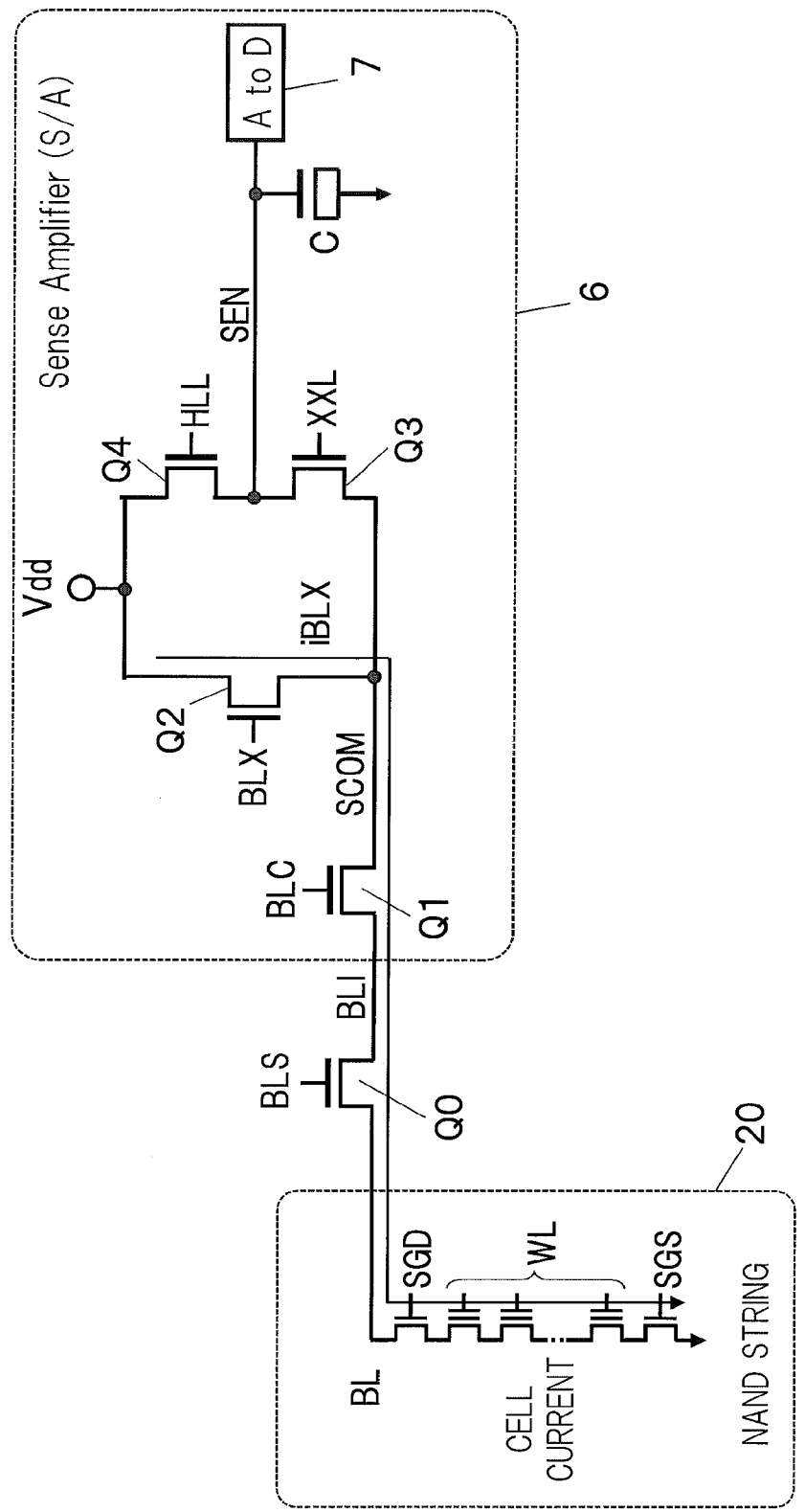
F I G. 3

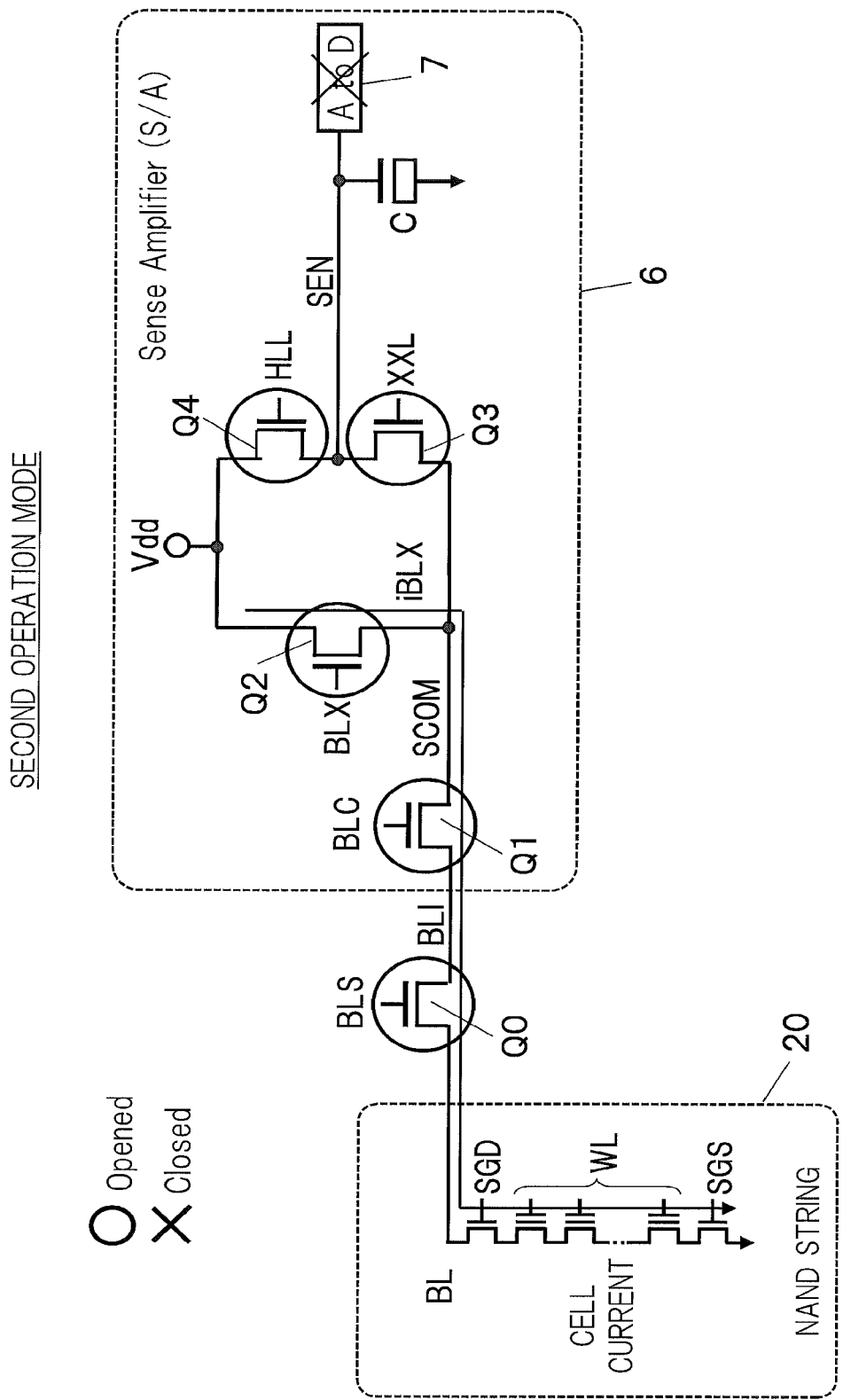
F I G. 5

SEMICONDUCTOR STORAGE DEVICE, AND METHOD FOR READING STORED DATA

TECHNICAL FIELD

An embodiment of the present invention relates to a semiconductor memory device and a stored data read method.

BACKGROUND ART

As large capacity recording media, non-volatile semiconductor memory devices including a NAND-type flash memory are used in various electronic apparatuses. This type of non-volatile semiconductor memory device converts data read from a selected memory cell into a desired voltage level by through a sense amplifier. A read operation of the sense amplifier is called a sense.

As one of sense methods, an all bit line (ABL) method is known. In the ABL method, after a bit line is precharged, the read operation is executed on all bit lines. Then, read data from the memory cell is detected on the basis of an amount of current flowing from the bit line.

In the ABL method, the bit line is first precharged. Then, a transistor connected to a sense node is turned on and a current from the corresponding bit line is transferred to the sense node. However, predetermined setup time is necessary until a gate voltage of the transistor reaches a voltage level to turn on the transistor. The setup time changes for each bit line. As a result, time when the transistor is turned on may also change for each bit line. For this reason, a read characteristic of the sense amplifier is deteriorated.

CITATION LIST

Patent Literature

Patent Literature 1: U.S. Pat. No. 7,974,133
Patent Literature 2: U.S. Pat. No. 7,881,120

SUMMARY OF INVENTION

Technical Problem

An object of the present invention is to provide a semiconductor memory device capable of improving a read characteristic of a sense amplifier and a stored data read method.

Solution to Problem

According to this embodiment, there is provided a semiconductor memory device. The semiconductor memory device includes a plurality of memory cells that are connected to a bit line; a sense amplifier that reads data stored in a memory cell selected from the plurality of memory cells via the bit line; and a controller that controls an operation of the sense amplifier. The sense amplifier has a first transistor that clamps a voltage of the bit line connected to the selected memory cell, a second transistor that is inserted between a voltage node clamped by the first transistor and a reference voltage node, a third transistor that is inserted between a charge/discharge node performing charge/discharge in accordance with the data stored in the selected memory cell and the voltage node clamped by the first transistor, and a fourth transistor that is inserted between the reference voltage node and the charge/discharge node. The controller has a first operation mode, a second operation mode, and a third operation mode that are executed sequentially when the data stored in the selected memory cell is read. In the first operation mode, the first transistor and the second transistor are turned on, the bit line connected to the selected memory cell is precharged, the charge/discharge node is precharged, and the third transistor is turned off. In the second operation mode, the third transistor is operated in an ON direction while the bit line is continuously precharged and resistance between a source and a drain of the third transistor is set to be higher than resistance between a source and a drain of the first transistor. In the third operation mode, the first transistor is turned on, the second transistor is turned off, the third transistor is turned on, and the fourth transistor is turned on and a discharge current from the charge/discharge node is allowed to flow to the bit line via the third transistor and the first transistor.

BRIEF DESCRIPTION OF DRAWINGS

FIG. 3 is a circuit diagram illustrating an example of an internal configuration of a sense amplifier 6.

FIG. 5 is a diagram illustrating operation states of the first to third transistors Q1 to Q3 in a second operation mode.

DESCRIPTION OF EMBODIMENTS

Figure 1:
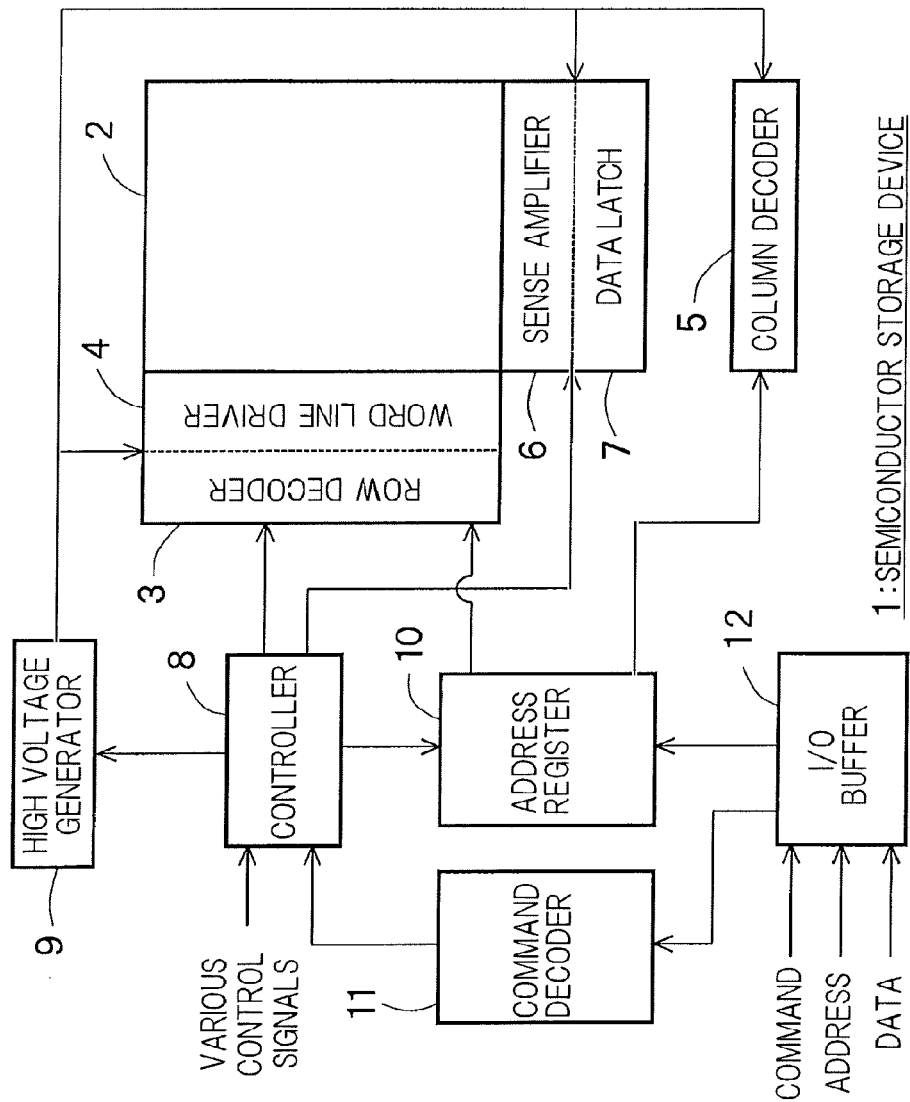
FIG. 1 is a block diagram illustrating a schematic configuration of a semiconductor memory device according to an embodiment of the present invention.

FIG. 1 is a block diagram illustrating a schematic configuration of a semiconductor memory device according to an embodiment of the present invention. The semiconductor memory device of FIG. 1 illustrates an example of a NAND-type flash memory.

A semiconductor memory device 1 of FIG. 1 includes a cell array 2, a row decoder 3, a word line driver 4, a column decoder 5, sense amplifiers (S/A) 6, data latch circuits 7, a controller 8, a high voltage generator 9, an address register 10, a command decoder 11, and an I/O buffer 12.

The cell array 2 includes NAND strings obtained by connecting a plurality of memory cells in series.

Figure 2:
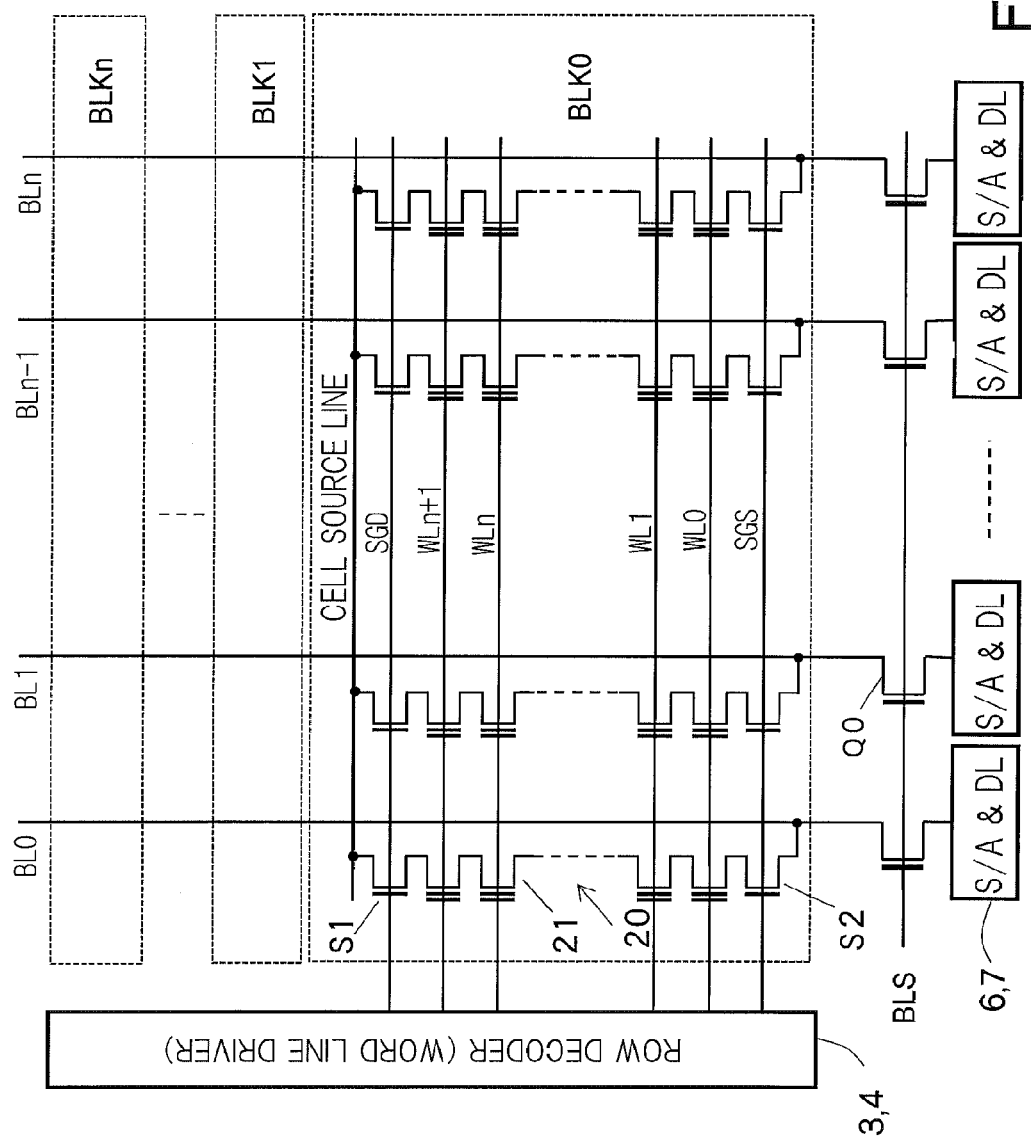
FIG. 2 is a block diagram illustrating a detailed configuration of a peripheral portion of a cell array 2.

FIG. 2 is a block diagram illustrating a detailed configuration of a peripheral portion of the cell array 2. As illustrated in FIG. 2, the cell array 2 is divided into a plurality of blocks BLK0 to BLKn. In each block, a plurality of NAND strings 20 are arranged in a column direction. Each NAND string 20 has a plurality of memory cells 21 that are connected in series, a selection gate transistor S1 that is connected to one end side of the memory cell 21, and a selection gate transistor S2 that is connected to the other end side.

Gates of the individual memory cells 21 in the NAND string 20 are connected to corresponding word lines WL0 to WLn+1. A gate of the selection gate transistor S1 is connected to a selection gate line SGD. A gate of the selection gate transistor S2 is connected to a selection gate line SGS. The individual NAND strings 20 are connected to a common cell source line via the corresponding selection gate transistors S1. In addition, the individual NAND strings 20 are connected to corresponding bit lines BL0 to BLn via the corresponding selection gate transistors S2.

The individual word lines WL0 to WLn+1 connected to the gates of the individual memory cells 21 in the NAND string 20 are connected to the row decoder 3. The row decoder 3 decodes a row address transferred from the address register 10. The word line driver 4 is disposed in the vicinity of the row decoder 3. The word line driver 4 generates a voltage to drive each word line, on the basis of decoded data.

The bit lines BL0 to BLn connected to the individual NAND strings 20 are connected to the sense amplifiers 6 via bit line selection transistors Q0. The sense amplifier 6 in this embodiment detects read data from the memory cell 21 in accordance with an amount of current flowing from the bit line, using an all bit line (ABL) method. The read data detected by the sense amplifier 6 is latched as binary data in the data latch circuit 7.

The column decoder 5 illustrated in FIG. 1 decodes a column address from the address register 10. In addition, the column decoder 5 determines whether the data latched in the data latch circuit 7 is transferred to a data bus, on the basis of a decoding result.

The I/O buffer 12 buffers an address, data, and a command input from an I/O terminal. In addition, the I/O buffer 12 transfers the address to the address register 10, transfers the command to a command register, and transfers the data to the data bus.

The controller 8 identifies the address and the command and controls an operation of the sense amplifier 6.

FIG. 3 is a circuit diagram illustrating an example of an internal configuration of the sense amplifier 6. FIG. 3 illustrates a circuit portion to sense a bit line BLI connected to one NAND string 20 including one selected memory cell 21. When the number of bit lines BL is n (n is an integer of 2 or more), n/m (m is an integer of 1 or more, for example, n or n/2) circuits equal to a circuit of FIG. 3 are provided. Hereinafter, a signal line passing the bit line selection transistor Q0 inserted between the bit line BL connected to the NAND string 20 and the sense amplifier 6, that is, a signal line between the sense amplifier 6 and the bit line selection transistor Q0 is called a bit line BLI for convenience.

As illustrated in FIG. 3, the sense amplifier 6 has a first transistor Q1 having a gate BLC, a second transistor Q2 having a gate BLX, a third transistor Q3 having a gate XXL, and a fourth transistor Q4 having a gate HLL. Each of the first to fourth transistors Q1 to Q4 is an NMOS transistor.

One of a source and a drain of each of the first transistor Q1, the second transistor Q2, and the third transistor Q3 is commonly connected. In the present specification, a common connection node is called an SCOM node.

The first transistor Q1 is provided between the bit line BLI connected to the NAND string 20 and the SCOM node. The second transistor Q2 is provided between a reference voltage node Vdd and the SCOM node. The third transistor Q3 and the fourth transistor Q4 are connected in series between the reference voltage node Vdd and the SCOM node. A reference voltage of the reference voltage node Vdd is a voltage generated in a NAND-type flash memory, on the basis of a power supply voltage provided from the outside.

An intermediate connection node of the third transistor Q3 and the fourth transistor Q4 is an output node of the sense amplifier 6. One end of a capacitor C and the data latch circuit 7 are connected to the output node. The intermediate connection node is called a SEN node in the present specification.

When the data of the selected memory cell 21 is read, the sense amplifier 6 according to this embodiment operates while sequentially switching a first operation mode, a second operation mode, and a third operation mode. The switching of the first to third operation modes is controlled by the controller 8. More specifically, the controller 8 switches operation states of the first to fourth transistors Q1 to Q4 in each of the first to third operation modes.

Figure 4:
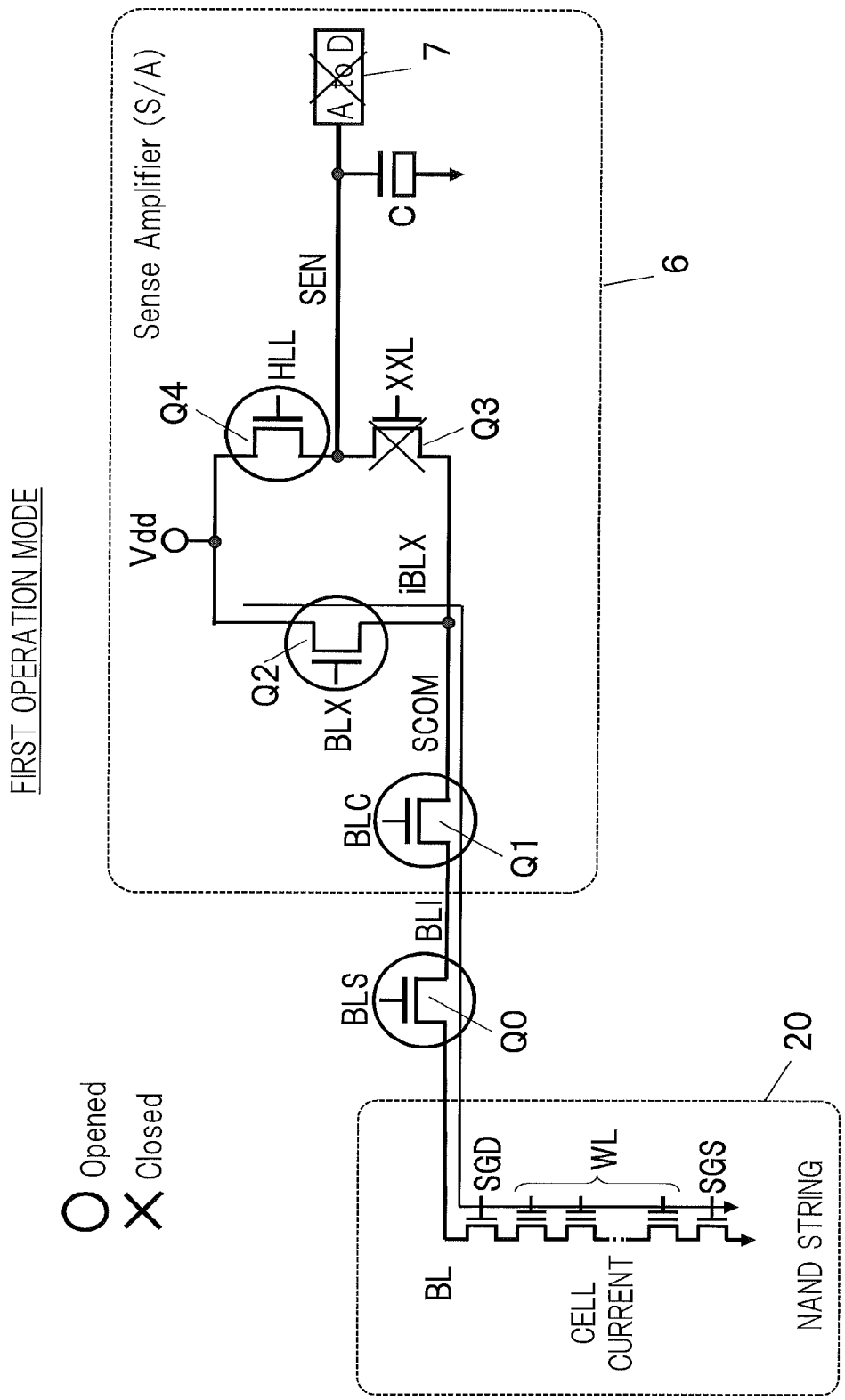
FIG. 4 is a diagram illustrating operation states of first to third transistors Q1 to Q3 in a first operation mode.
Figure 6:
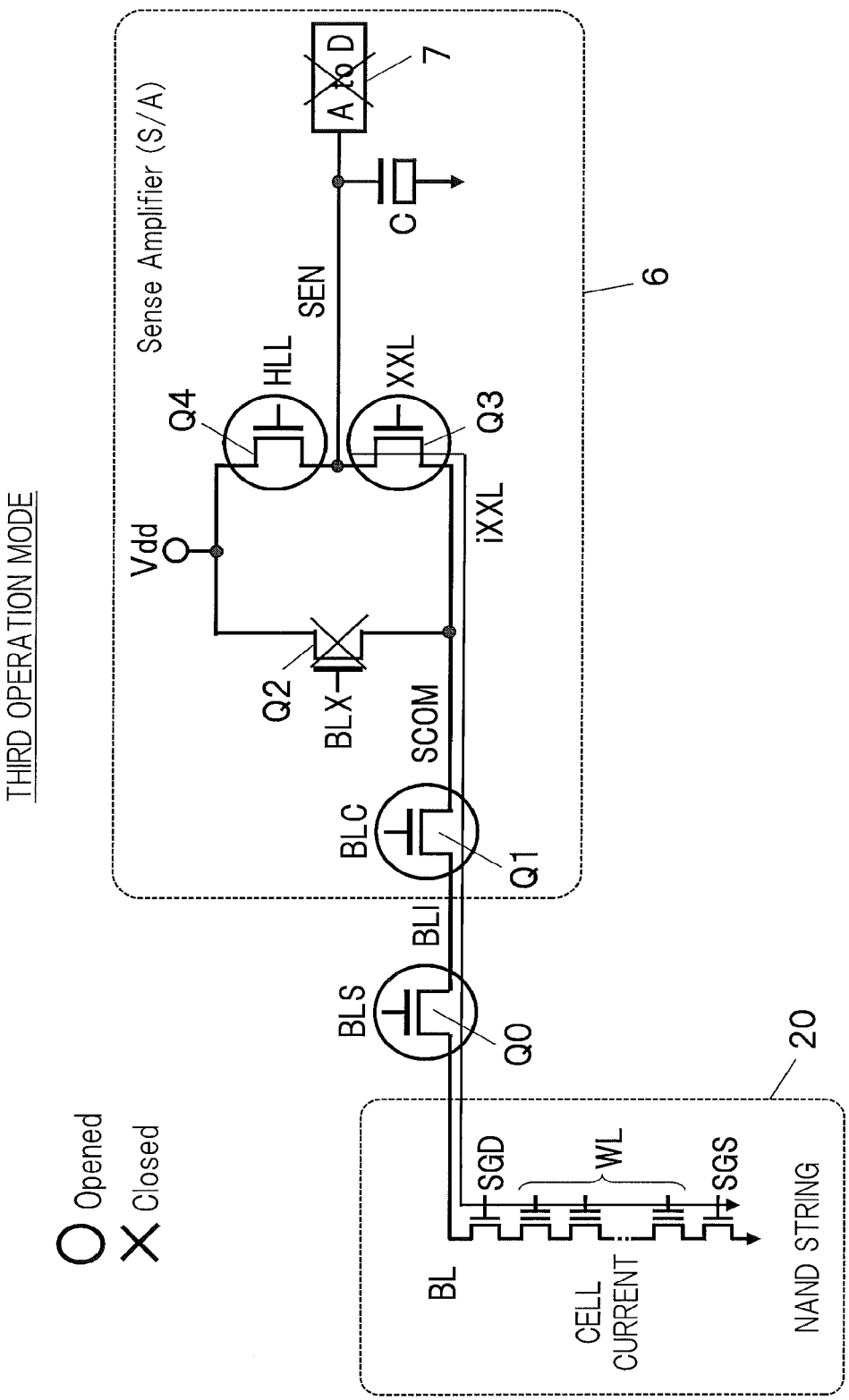
FIG. 6 is a diagram illustrating operation states of the first to third transistors Q1 to Q3 in a third operation mode.
Figure 7:
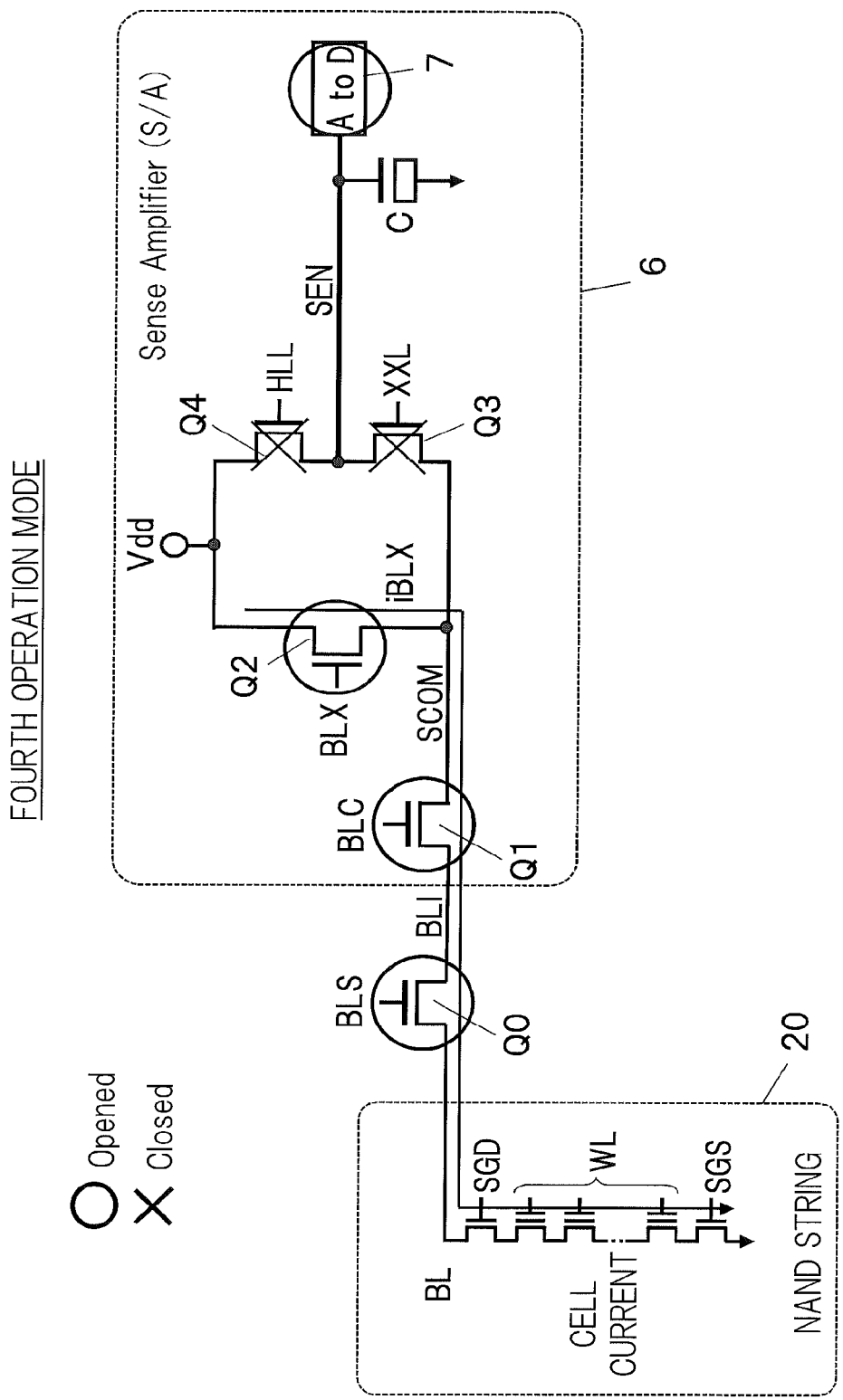
FIG. 7 is a diagram illustrating operation states of the first to third transistors Q1 to Q3 in a fourth operation mode.
Figure 8:
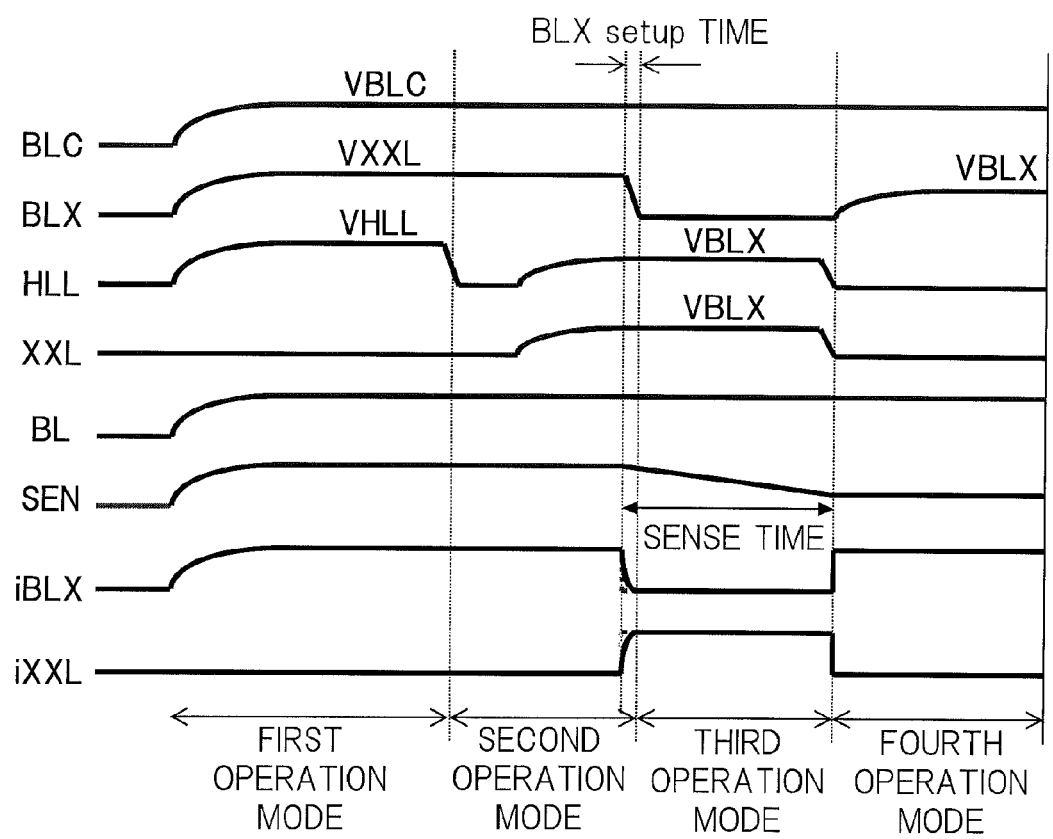
FIG. 8 is an internal voltage/current waveform diagram of the sense amplifier 6 in the first to fourth operation modes.

FIGS. 4 to 6 are diagrams illustrating the operation states of the first to third transistors Q1 to Q3 in the first to third operation modes, respectively. FIG. 7 is a diagram illustrating the operation states of the first to third transistors Q1 to Q3 in a fourth operation mode executed after the third operation mode. FIG. 8 is an internal voltage/current waveform diagram of the sense amplifier 6 in the first to fourth operation modes. In FIGS. 4 to 7, the transistors operating in an ON direction are marked with circles and the transistors to be turned off are marked with X. When the latch operation is executed, the data latch circuit 7 is marked with a circle and when the latch operation is not executed, the data latch circuit 7 is marked with X.

The first operation mode is a mode in which the bit line BLI connected to the NAND string 20 including the selected memory cell 21 is precharged and the corresponding SEN node is precharged. In a period of the first operation mode, as illustrated in FIG. 4, the transistors Q1, Q2 and Q4 are set to ON and the third transistor Q3 is set to OFF. The first and second transistors Q1 and Q2 are turned on, so that a current from the reference voltage node flows to the corresponding bit line BL via the second transistor Q2 and the first transistor Q1, and the bit line BL is precharged. In addition, in the period of the first operation mode, the fourth transistor Q4 is set to ON and the third transistor Q3 is set to OFF, so that the current from the reference voltage node flows to the SEN node via the fourth transistor Q4, and the capacitor C is charged.

As a result, as illustrated in FIG. 8, in the first operation mode, the gate BLC of the first transistor Q1 is boosted to a voltage VBLC, the gate BLX of the second transistor Q2 is boosted to a voltage VXXL, and the gate HLL of the fourth transistor Q4 is boosted to a voltage VHLL. In addition, the gate XXL of the third transistor Q3 is set to a low level.

The gate voltage VBLC of the gate BLC of the first transistor Q1 in the first operation mode and the voltage VXXL of the gate BLX of the second transistor Q2 are set to satisfy a relation of the following formula (1).

$$VBLC < VXXL \tag{1}$$

The reason why the voltages are set as described above is to allow the first transistor Q1 to clamp a voltage level of the bit line BLI surely by the gate voltage VBLC. If VBLC>VXXL is satisfied, a voltage level of the SCOM node becomes lower than a voltage level of the gate voltage VBLC, the first transistor Q1 is turned on, and the bit line BLI may not be set to a voltage lower than the gate voltage VBLC by a threshold voltage.

The precharge of the SEN node does not need to be performed using the fourth transistor Q4 to be turned on and the precharge of the SEN node may be performed using other circuit. When the precharge of the SEN node is performed using other circuit, the voltage of the gate HLL of the fourth transistor Q4 is set to a low level, for example.

The second operation mode executed subsequent to the first operation mode is a mode to make preparations for suppressing a variation of the voltage level of the SEN node maximally in the following third operation mode. In a period of the second operation mode, as illustrated in FIG. 5, ON states of the first and second transistors Q1 and Q2 are maintained and the third transistor Q3 is switched from an OFF direction to an ON direction. In addition, the fourth transistor Q4 is turned on.

More specifically, in the second operation mode, a voltage of the gate XXL of the third transistor Q3 is set to a voltage lower than a voltage of the gate BLX of the second transistor Q2. As a result, resistance between a source and a drain of the third transistor Q3 becomes larger than resistance between a source and a drain of the second transistor Q2. Likewise, a voltage of the gate HLL of the fourth transistor Q4 is set to a voltage lower than a voltage of the gate HLL of the second transistor Q2. As a result, the resistance between the source and the drain of the fourth transistor Q4 becomes larger than the resistance between the source and the drain of the second transistor Q2.

Thereby, the current from the reference voltage node Vdd flows to the bit line BLI via the second transistor Q2 and the precharge of the bit line BL is continuously performed. In addition, the current can be prevented from flowing from the SEN node to the reference voltage node Vdd via the fourth transistor Q4 or from the reference voltage node Vdd to the SEN node via the fourth transistor Q4. In addition, the current from the SEN node can be prevented from flowing to the SCOM node via the third transistor Q3.

The third operation mode executed subsequent to the second operation mode is a mode in which the SEN node is discharged. In a period of the third operation mode, as illustrated in FIG. 6, the first transistor Q1 is set to ON, the second transistor Q2 is set to OFF, the fourth transistor Q4 is set to ON, and the third transistor Q3 is set to ON. More specifically, as illustrated in FIG. 8, the voltage of the gate BLC of the first transistor Q1 is held at the same voltage VBLC as the first and second operation modes, the voltage of the gate BLX of the second transistor Q2 is set to a low level, and both the voltages of the gate XXL of the third transistor Q3 and the gate HLL of the fourth transistor Q4 are set to a voltage VBLX.

A magnitude relation of the voltage VBLX and the voltages VBLC and VXXL in the formula (1) is represented by the following formula (2).

$$VBLC \leq VBLX < VXXL \qquad (2)$$

The reason why the voltage VBLX is set to the voltage VBLC or more is to cause the voltage of the SCOM node not to become lower than the voltage VBLC of the gate BLC of the first transistor Q1, as described above. In addition, the voltage VXXL is set high, so that the current from the SEN node is easy to flow to the bit line BLI.

In the third operation mode, when zero is stored in the selected memory cell 21, charges accumulated in the capacitor C are discharged via the SEN node, the third transistor Q3, the first transistor Q1, and the bit line BLI.

At timing becoming a trigger starting the third operation mode, the voltage of the gate BLX of the second transistor Q2 decreases to a low level. As a result, the second transistor Q2 is turned off quickly and a current iBLX flowing between the source and the drain of the second transistor Q2 is switched steeply.

In addition, when the third operation mode starts, the voltage of the gate XXL of the third transistor Q3 becomes already the high voltage VBLX and the current iXXL from the SEN node flows quickly in a direction of the bit line BLI via the third transistor Q3.

As such, in this embodiment, when the operation mode changes from the second operation mode to the third operation mode, the current iBLX and the current iXXL change steeply. This means that timing when a potential of the SEN node changes can be suppressed from varying.

In the third operation mode, the voltage of the gate XXL of the transistor Q3 is preferably set to be equal to or higher than the voltage of the gate HLL of the transistor Q4. The reason is to flow a current to the bit line BL corresponding to the SEN node where the discharge has ended early, along a path of Vdd→transistor Q4→transistor Q3→SCOM node-→transistor Q1→bit line BL, clamp a potential of the bit line BL at the voltage of the gate HLL of the transistor Q4, and reduce the variation in the potential of the bit line BL. Another reason is to prevent the current from leaking from the SEN node to the reference voltage node Vdd, by setting ON resistance of the transistor Q3 to be equal to or lower than ON resistance of the transistor Q4, because a discharge current preferably flows from the SEN node to the SCOM node basically.

If the potential of the SEN node is stabilized in the third operation mode, the operation mode changes to the fourth operation mode. The fourth operation mode is a mode in which binary data in accordance with the potential of the SEN node is latched by the data latch circuit 7. In a period of the fourth operation mode, as illustrated in FIG. 7, the data latch circuit 7 enters an enable state and the first transistor Q1 is set to ON, the second transistor Q2 is set to ON, and the third transistor Q3 and the fourth transistor Q4 are set to OFF. Both the third transistor Q3 and the fourth transistor Q4 are turned off, so that the potential of the SEN node is fixed, and in this state, the data latch circuit 7 executes the latch operation.

In addition, the reason why the both the first transistor Q1 and the second transistor Q2 are set to ON in the fourth operation mode is to precharge the bit line BLI as preparations executing a next read operation through the bit line BLI. The above operation has no connection with an operation for transferring the data read in the first to third operation modes to the data latch circuit 7. That is, when only the operation for latching the data read from the selected memory cell by the data latch needs to be executed, only the fourth transistor Q4 and the third transistor Q3 may be turned off and the first transistor Q1 and the second transistor Q2 do not need to be turned on.

A variation ΔV of the voltage by the discharge of the SEN node in the fourth operation mode is represented by ΔV=I× t/C. I expresses a discharge current flowing through the SEN node, t expresses a period (sense period) in which the discharge current flows, and C expresses a capacity of the SEN node including the capacitor C. As known from the above formula, if the capacity and the sense period are fixed, the variation ΔV of the voltage is determined by the discharge current I. In actuality, ΔV may be varied by electric characteristics of the first transistor Q2 and the third transistor Q3. However, according to this embodiment, in the third operation mode, the second transistors Q2 is turned off quickly and the third transistor Q3 is turned on quickly, so that the variation of ΔV can be suppressed.

Figure 9:
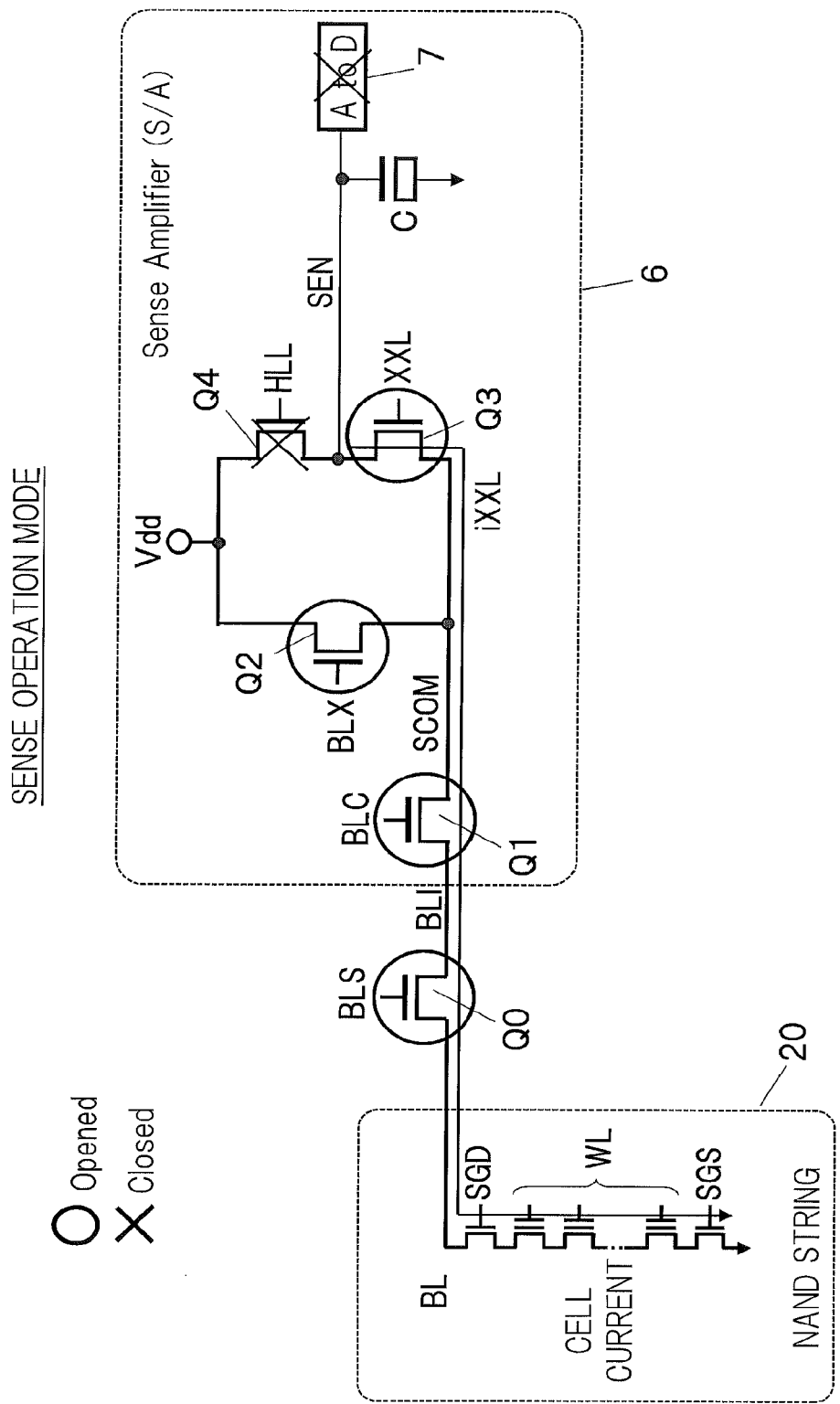
FIG. 9 is a diagram illustrating operation states of the first to third transistors Q3 in a sense operation mode according to a comparative example.
Figure 10:
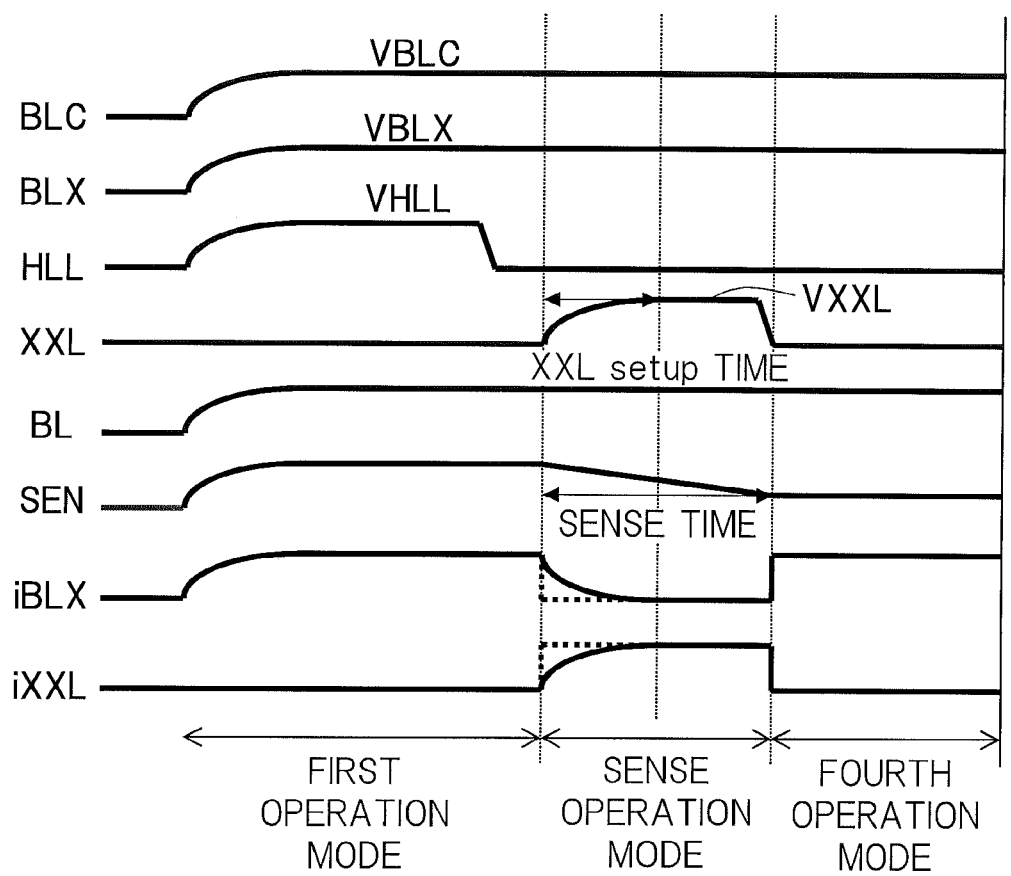
FIG. 10 is an internal voltage/current waveform diagram of the sense amplifier 6 in the comparative example.

FIGS. 9 and 10 are diagrams illustrating a comparative example. FIG. 9 is a diagram illustrating operation states of the first to third transistors Q1 to Q3 in a sense operation mode executed instead of the second operation mode and the third operation mode and FIG. 10 is an internal voltage/current waveform diagram of the sense amplifier 6 in the comparative example.

In the comparative example, the sense operation mode of FIG. 9 is executed after the same first operation mode as FIG. 4 is executed. Then, the same fourth operation mode as FIG. 7 is executed.

In the sense operation mode of FIG. 9, the first transistor Q1 is set to ON, the second transistor Q2 is set to ON, the fourth transistor Q4 is set to OFF, and the third transistor Q3 is set to ON. A voltage of a gate HIL of the fourth transistor Q4 is set to be higher than the voltage of the gate BLX of the second transistor Q2, such the current from the reference voltage node does not flow to the second transistor Q2 instead of the fourth transistor Q4. As a result, when zero is stored in the selected memory cell 21, charges accumulated in the capacitor C are discharged via the SEN node, the third transistor Q3, the first transistor Q1, and the bit line BLI.

In the case of FIG. 9, when the operation mode is switched to the sense operation mode, the discharge of the SEN node is ideally determined by the current of the memory cell 21. In actuality, because the gate XXL of the third transistor Q3 has a wiring capacity and a gate load, it takes predetermined setup time to set the voltage of the gate XXL to a desired voltage. In addition, the current flowing between the source and the drain of the third transistor Q3 is affected by variations of the second transistor Q2 and the third transistor Q3. As a result, as illustrated in FIG. 10, it takes time to stabilize the current iBLX flowing between the source and the drain of the second transistor Q2. Likewise, it takes time to stabilize the current iXXL flowing from the SEN node to the bit line BLI via the third transistor Q3. Therefore, in the sense operation mode of FIG. 9, a variation of timing until the potential of the SEN node is stabilized for each sense amplifier 6 increases.

Meanwhile, according to the second and third operation modes in this embodiment illustrated in FIGS. 5 and 6, when the operation mode is switched to the third operation mode, the current iBLX and the current iXXL can be stabilized quickly and the variation of the potential of the SEN node can be suppressed.

As such, in this embodiment, the second operation mode is provided between the first operation mode in which the bit line BLI and the SEN node are precharged and the third operation mode in which the SEN node is discharged. In the second operation mode, because the third transistor Q3 is driven in an ON direction, the second transistor Q2 is turned off when the operation mode is switched from the second operation mode to the third operation mode. For this reason, the current iXXL flowing from the SEN node to the bit line BLI via the third transistor Q3 and the current iBLX flowing between the source and the drain of the second transistor Q2 can be changed steeply. As a result, the variation until the potential of the SEN node is stabilized can be suppressed. Therefore, a read characteristic of the sense amplifier is improved.

In the embodiment described above, the example of the case in which the present invention is applied to the NAND-type flash memory has been described. However, the present invention can be applied to various non-volatile semiconductor memory devices such as a NOR-type flash memory, an MRAM, and a ReRAM.

An aspect of the present invention is not limited to each embodiment described above and includes various modifications devised by those skilled in the art and the effect of the present invention is also not limited to the content described above. That is, various additions, changes, and partial deletions can be made without departing from the spirit and the scope of the present invention derived from content defined by claims and equivalents thereof.

REFERENCE SIGNS LIST

1 semiconductor memory device
2 cell array
3 row decoder
4 word line driver
5 column decoder
6 sense amplifier
7 data latch circuit
8 controller
9 high voltage generator
10 address decoder register
11 command decoder
12 I/O buffer
20 NAND string
21 memory cell

The invention claimed is:

1. A semiconductor memory device comprising:
a memory cell;
a sense amplifier that reads data stored in the memory cell; and
a controller that controls an operation of the sense amplifier,
wherein the sense amplifier comprises
a first transistor that clamps a voltage of a bit line connected to the memory cell,
a second transistor that is provided between a voltage node clamped by the first transistor and a reference voltage node,
a third transistor that is provided between a charge/discharge node performing charge/discharge in accordance with the data stored in the memory cell and the voltage node clamped by the first transistor, and
a fourth transistor that is provided between the reference voltage node and the charge/discharge node,
the controller executes a first operation mode, a second operation mode after the first operation mode, and a third operation mode after the second operation mode when the data stored in the selected memory cell is read,
in the first operation mode, the first transistor and the second transistor are turned on and the third transistor is turned off,
in the second operation mode, the third transistor is turned on, and
in the third operation mode, the first transistor is turned on, the second transistor is turned off, the third transistor is turned on, and the fourth transistor is turned on.

2. The semiconductor memory device according to claim 1,
wherein each of the first to third transistors is an NMOS transistor, and
in the second operation mode, the controller sets a gate voltage of the second transistor higher than gate voltages of the third transistor and the fourth transistor.

3. The semiconductor memory device according to claim 2, wherein, in the second operation mode, the controller sets the gate voltages of the fourth transistor and the third transistor equal to or higher than a gate voltage of the first transistor.

4. The semiconductor memory device according to claim 1,
wherein, in the first operation mode, the controller turns on the fourth transistor.

5. The semiconductor memory device according to claim 1,
wherein, in the third operation mode, the controller sets a gate voltage of the third transistor equal to or higher than a gate voltage of the fourth transistor.

6. The semiconductor memory device according to claim 1,
wherein, in the first operation mode, the controller sets a gate voltage of the second transistor equal to or higher than a gate voltage of the first transistor.

7. The semiconductor memory device according to claim 1, further comprising:
a latch that latches data in accordance with a potential of the charge/discharge node; and
a capacitor connected to the charge/discharge node,
wherein, in a fourth operation mode executed after the third operation mode, the controller turns off the third transistor and the fourth transistor and transfers charges accumulated in the capacitor to the latch.

8. The semiconductor memory device according to claim 1,
wherein the bit line is connected to a plurality of memory cells,
the sense amplifier reads data stored in the memory cell selected from the plurality of memory cells via the bit line,
in the first operation mode, the bit line connected to the selected memory cell and the charge/discharge node are precharged, and
in the third operation mode, a discharge current from the charge/discharge node is allowed to flow to the bit line via the third transistor and the first transistor.

9. A stored data read method for reading data stored in a memory cell selected from a plurality of memory cells connected to a bit line via the bit line, comprising:
executing a first operation mode in which both a first transistor clamping a voltage of the bit line connected to the selected memory cell and a second transistor inserted between a voltage node clamped by the first transistor and a reference voltage node are turned on, the bit line connected to the selected memory cell is precharged, the charge/discharge node is precharged, and a third transistor inserted between a charge/discharge node performing charge/discharge in accordance with the data stored in the selected memory cell and the voltage node clamped by the first transistor is turned off;
executing a second operation mode in which the third transistor is operated in an ON direction while the bit line is continuously precharged and resistance between a source and a drain of the third transistor is set to be higher than resistance between a source and a drain of the first transistor; and
executing a third operation mode in which the first transistor is turned on, the second transistor is turned off, the third transistor is turned on, and a fourth transistor inserted between the reference voltage node and the charge/discharge node is turned on, and a discharge current from the charge/discharge node is allowed to flow to the bit line via the third transistor and the first transistor.

* * * * *

UNITED STATES PATENT AND TRADEMARK OFFICE
CERTIFICATE OF CORRECTION

PATENT NO. : 9,666,295 B2
APPLICATION NO. : 14/990090
DATED : May 30, 2017
INVENTOR(S) : Sibo Ma et al.

It is certified that error appears in the above-identified patent and that said Letters Patent is hereby corrected as shown below:

On the Title Page

Item (54) and in the Specification, Column 1, the Title is incorrect. Item (54) and Column 1 should read:

-- SEMICONDUCTOR MEMORY DEVICE AND STORED DATA READ METHOD --

Signed and Sealed this
Eighth Day of May, 2018

Andrei Iancu
*Director of the United States Patent and Trademark Office*